United States Patent
Atrash et al.

(10) Patent No.: US 7,109,697 B1
(45) Date of Patent: Sep. 19, 2006

(54) TEMPERATURE-INDEPENDENT AMPLIFIER OFFSET TRIM CIRCUIT

(75) Inventors: Amer Hani Atrash, Dallas, TX (US); Shanmuganand Chellamuthu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/170,909

(22) Filed: Jun. 29, 2005

(51) Int. Cl.
*G05F 3/16* (2006.01)
*H03F 1/02* (2006.01)
*H03K 1/10* (2006.01)

(52) U.S. Cl. .............. 323/316; 323/280; 323/907; 327/513; 327/539; 330/9

(58) Field of Classification Search .............. 323/314, 323/315, 316, 280, 907; 327/513, 539, 540, 327/541; 330/9, 253, 256, 257, 261
See application file for complete search history.

(56) References Cited

U.S. PATENT DOCUMENTS

| | | | |
|---|---|---|---|
| 5,386,160 A * | 1/1995 | Archer et al. | 327/513 |
| 6,002,276 A * | 12/1999 | Wu | 327/513 |
| 6,194,962 B1 * | 2/2001 | Chen | 330/9 |
| 6,396,339 B1 | 5/2002 | Jacobs | |

* cited by examiner

*Primary Examiner*—Jessica Han
(74) *Attorney, Agent, or Firm*—J. Dennis Moore; W. James Brady; Frederick J. Telecky, Jr.

(57) ABSTRACT

An operational amplifier having temperature-compensated offset correction. The amplifier includes an operational amplifier circuit, that has a first input field effect transistor (FET) having a gate connected to receive a first input signal, and a second input FET having a gate connected to receive a second input signal, the first and the second input FETs being connected together to receive a first bias current, and also being connected to respective sides of a first current mirror. A correction amplifier circuit is also provided, that has a first correction FET having a gate, and a second correction FET having a gate, the first and the second correction FETs being connected together to receive a second bias current, and also being connected to respective sides of a second current mirror. A resistor is arranged to have a fixed voltage provided across it, one terminal of the resistor being connected to the gate of the first correction FET and the other terminal of the resistor being connected to the gate of the second correction FET. A first bias FET is connected to conduct an "extra" current from the second correction FET that is blocked by the current mirror action from flowing through the second current mirror. A second bias FET is connected in current mirror configuration with the first bias FET to form a third current mirror, and is configured to mirror and scale the current through the first bias FET to a selected one of the first input FET and the second input FET.

6 Claims, 1 Drawing Sheet

TEMPERATURE-INDEPENDENT AMPLIFIER OFFSET TRIM CIRCUIT

TECHNICAL FIELD OF THE INVENTION

The present invention relates to operational amplifier circuits, and more particularly relates to methods and circuits for reducing offset between input voltages in such circuits.

BACKGROUND OF THE INVENTION

The operational amplifier, or, "op-amp," is a widely used electronic circuit that amplifies the difference between two input voltages. Ideally, for a zero difference between the voltages across the two inputs, the output of the op-amp is also zero. However, actual op-amps typically generate some non-zero output voltage for a zero input. The voltage applied across the inputs that causes the amplifier to provide a zero output voltage is called the "input offset voltage."

The imbalance giving rise to a non-zero output for a zero input in an op-amp is caused by variations in the input circuitry, for example due to a mismatch between the two differential input transistors common to op-amps. These variations can arise either systematically or randomly.

Systematic variations can typically be substantially eliminated by careful design. Random mismatch can also be reduced by careful design, but will always exist in the physical integrated circuits, due to variations that arise in the integrated circuit fabrication process. To correct the effects of random mismatch, trimming circuits are commonly used. Such circuits can reduce the effect of random mismatch, but may also introduce a temperature-dependent factor into the required input offset voltage.

FIG. 1 is a circuit diagram showing a typical prior art op-amp having trim type offset correction circuitry. In this circuit, the amplifier circuit 11 has P-type field effect transistor ("PFET") input devices MPamp1 and MPamp2, the gates of which constitute the minus input AMINUS and plus input APLUS of the amplifier, respectively. Offset correction is provided by correction circuitry 12. An N-type field effect transistor ("NFET") MN5 is biased with bias voltage nbias to provide a constant current that is scaled through a series of current mirrors MP4:MP5–8. Switches MNsw1–4 allow for selectability of the desired scaled current level. These current legs are typically binary weighted, allowing for $2^4$ available trim settings. The resulting scaled current is scaled again through a current mirror MN4:MN6, and directed to the positive or negative side of the amplifier according to the sign of the select signal b4. In general, this trim current creates a current mismatch between devices MPamp1 and MPamp2 that forces a voltage mismatch between the inputs APLUS and AMINUS intended to exactly cancel the random mismatch that exists between devices MPamp1 and MPamp2.

The bias voltage nbias for device MN5 is typically generated by the use of a current mirror with a fixed current source, such as in the circuit shown in FIG. 2, in which the constant current source Itrim sets up bias voltage nbias through NFET device MN3. In effect, the constant current from current source Itrim is mirrored through NFET device MN5 (FIG. 1). The problem with this is that the input offset voltage generated from a fixed current such as in FIGS. 1 and 2 is not constant with temperature. At higher temperatures a larger voltage offset is generated from the same current mismatch through devices MPamp1 and MPamp2 than at lower temperatures. Therefore, the offset trim created by the fixed current source Itrim has a temperature coefficient.

One example of a trimming circuit that corrects for such a temperature coefficient is disclosed in U.S. Pat. No. 6,396,339, which issued on May 28, 2002, to Karl H. Jacobs, and is commonly assigned. The invention disclosed in this patent compensates for fabrication process and temperature drift mismatches without the additional temperature compensation circuitry typically used in prior art approaches. It does so by equalizing leakage currents on both sides of the op-amp.

However, while the invention disclosed in the Jacobs patent represents a significant advance in the art, it does not completely solve the problem of the drift of amplifier offset trim over temperature.

SUMMARY OF THE INVENTION

The present invention provides an operational amplifier having temperature-compensated offset correction. The amplifier includes an operational amplifier circuit, that has a first input field effect transistor (FET) having a gate connected to receive a first input signal, and a second input FET having a gate connected to receive a second input signal, the first and the second input FETs being connected together to receive a first bias current, and also being connected to respective sides of a first current mirror. A correction amplifier circuit is also provided, that has a first correction FET having a gate, and a second correction FET having a gate, the first and the second correction FETs being connected together to receive a second bias current, and also being connected to respective sides of a second current mirror. A resistor is arranged to have a fixed voltage provided across it, one terminal of the resistor being connected to the gate of the first correction FET and the other terminal of the resistor being connected to the gate of the second correction FET. A first bias FET is connected to conduct an "extra" current from the second correction FET that is blocked by the current mirror action from flowing through the second current mirror. A second bias FET is connected in current mirror configuration with the first bias FET to form a third current mirror, and is configured to mirror and scale the current through the first bias FET to a selected one of the first input FET and the second input FET.

These and other aspects and features of the invention will be apparent to those skilled in the art from the following detailed description of the invention, taken together with the accompanying drawings.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

In general, the invention generates a trim current that automatically adjusts its magnitude to provide a constant input voltage offset over temperature. As such, it may be used with approaches that address offset drift with temperature by compensating for other temperature-dependent factors that affect overall input voltage offset drift with temperature, such as the approach in the Jacobs patent, which seeks to reduce the effects of leakage currents on the amplifier offset. Or, it may be used alone to provide a substantial solution to the problem of varying input voltage offset over temperature.

Figure 3:
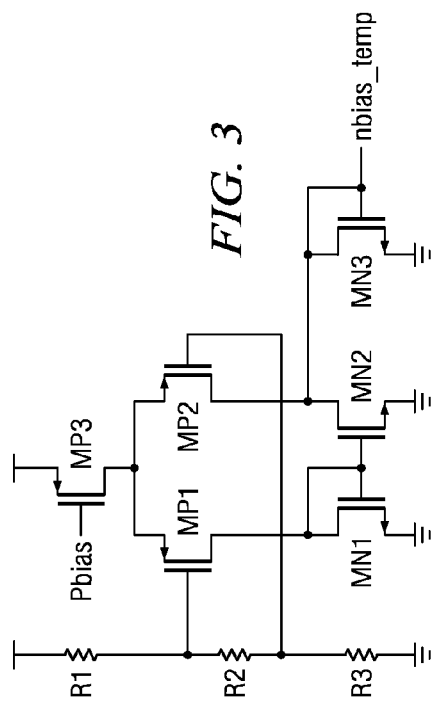
FIG. 3 is a circuit diagram of an op-amp having trim-type offset correction circuitry, in accordance with a preferred embodiment of the present invention.
Figure 2:
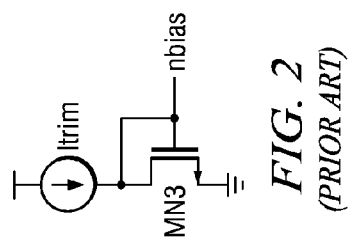
FIG. 2 is a circuit diagram of a representative prior art bias voltage generation circuit for the circuit of FIG. 1.

FIG. 3 is a circuit diagram showing a preferred embodiment 30 of the present invention, which is, essentially, a correction amplifier. In circuit 30 a temperature-independent voltage reference is used to generate a bias current which is used as the basis for generating the bias voltage nbias_temp which is used, in turn, to generate the offset current. Therefore, the bias current adjusts automatically based on temperature and on the fixed voltage reference, and also adjusts automatically the offset current to stabilize the input offset voltage over temperature. The bias voltage nbias_temp may be used to bias a circuit such as the circuit of FIG. 1, where bias voltage nbias_temp is used instead of bias voltage nbias.

In circuit 30 resistors R1, R2 and R3 are series connected between the supply voltage Vdd and ground to form a voltage divider. The connection node of resistors R1 and R2 is connected to the gate of a PFET device MP1, while the connection node of resistors R2 and R3 is connected to the gate of a PFET device MP2. The sources of devices MP1 and MP2 are connected together and to the drain of a PFET device MP3, the source of which is connected to Vdd and the gate of which is connected to receive a bias voltage Pbias., which is preferably the same as the bias voltage Pbias applied to the corresponding device MPamp3 in amplifier 11 of FIG. 1, assuming otherwise identical parameters comparing correction amplifier 30 with amplifier 11. Note that the circuits need not be identical, but, instead, may be scaled one with respect to the other in bias current and device ratios, for example. Or, the Pbias voltage could be the same for both amplifiers and the scaling done witth the corresponding current source devices, MP3 and MPamp3.

The drain of device MP1 is connected to the drain and gate of an NFET device MN1, while the drain of device MP2 is connected to the drain and gate of an NFET device MN2, with devices drain of device MP1 is connected to the drain and gate of an NFET device MN1 and MN2 having their sources connected to ground and their gates connected together in a current mirror configuration. The connection node of devices MP2 and MN2 is connected to the drain and gate of NFET device MN3, the source of which is connected to ground. The gate of device MN3 provides bias voltage nbias_temp.

In operation, a fixed voltage is present across resistor R2 that is used to force a voltage offset between devices MP1 and MP2, which comprise the input devices of a correction amplifier. The sizes R1, R2 and R3 of resistors R1, R2 and R3, respectively, are chosen based on the desired offset in across the input devices MPamp1 and MPamp2 of amplifier 11 of FIG. 1, and the magnitude of Vdd. As described below, with an exemplary Vdd of 5 V, typical values would be R1=40 k$\Omega$, R2=4 k$\Omega$ and R3=56 k$\Omega$. These values result in a 200 mV voltage difference across the input devices MP1 and MP2 of the correction amplifier 30, which is a selected multiple of the offset desired for devices MPamp1 and MPamp2 of amplifier 11.

Figure 1:
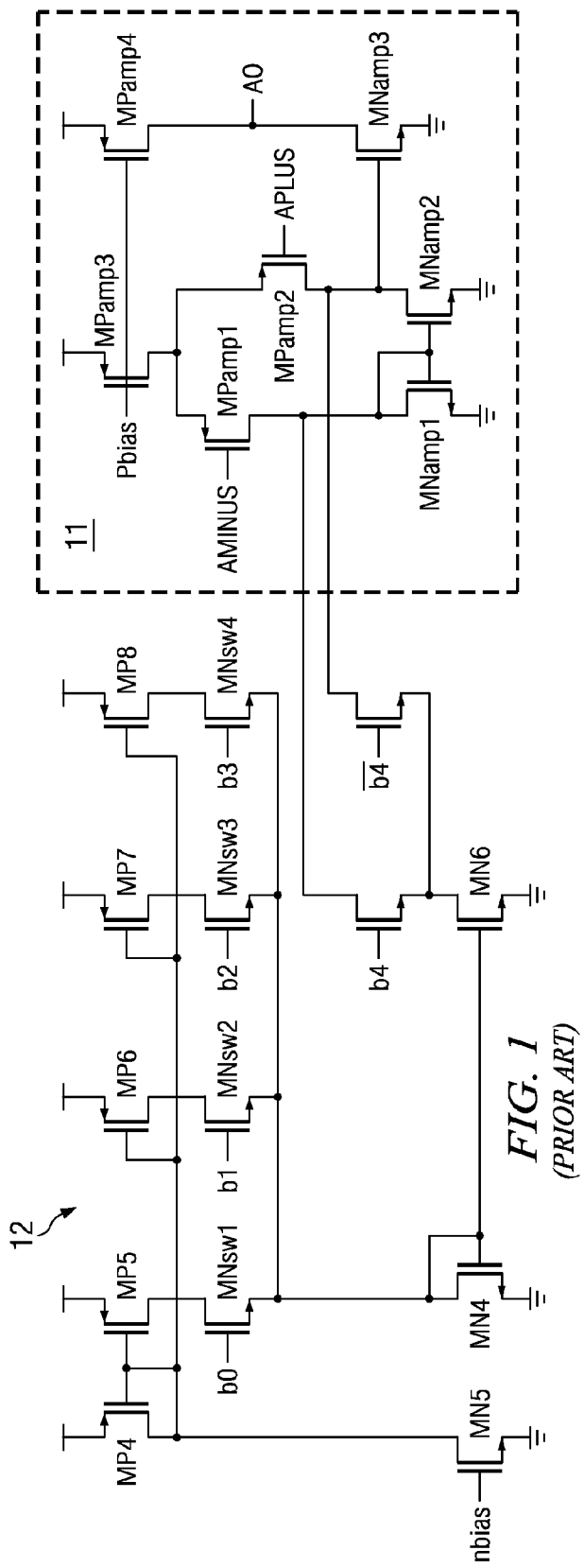
FIG. 1 is a circuit diagram of a representative prior art op-am with trim-type offset correction circuitry.

The correction amplifier operates to mimic the input stage of the amplifier that is to be trimmed, for example amplifier 11 of FIG. 1. Thus, the voltage difference between the gates of devices MP1 and MP2 forces a current offset between them. However, devices MN1:MN2 have identical current, since they are configured as a current mirror. The extra current flowing through device MP2 flows through device MN3 and is mirrored to the input bias transistor of the trim circuit, for example device MN5 of FIG. 1, by way of the bias voltage nbias_temp generated by this extra current. Since this bias voltage is created from a fixed voltage offset, it automatically adjusts for temperature variations to thereby produce the same offset, i.e., temperature compensated, in the amplifier that is being trimmed.

The circuit designer applying the principles of the invention in a particular context should note that the offset trim is in the order of ones of millivolts, for example 2 mV. Attempting to create a fixed offset across the resistor establishing the offset-inducing voltage, e.g., resistor R2 in FIG. 3, in this range will lead to errors in the bias current resulting from any mismatch between devices MP1 and MP2. To avoid this problem, the forced offset should be produced at a magnitude that is a large multiple of the desired correction, for example 100× scaling, as in the embodiment discussed above. The correction current is then scaled down through the current mirror ratios MN5:MN3, MP4:MP5–8, and MN4:MN6.

Although the present invention and its advantages have been described in detail, it should be understood that various changes, substitutions and alterations can be made herein without departing from the spirit and scope of the invention as defined by the appended claims. For example, the polarity of the voltages and components of the circuit in FIG. 3 may be reversed, of course. In addition, as mentioned above, scaling considerations are matters of choice for the designer. Further, other circuit configurations can be conceived that utilize a fixed voltage to establish an offset between two devices that is mirrored to one side of an operational amplifier.

What is claimed is:

1. An operational amplifier having temperature-compensated offset correction, comprising:

an operational amplifier circuit, comprising a first input field effect transistor (FET) having a gate connected to receive a first input signal, and a second input FET having a gate connected to receive a second input signal, the first and the second input FETs being connected together at a first connection at one of their source and drain and receiving a first bias current at said connection, and being connected to respective sides of a first current mirror by the other of their source and drain;

a correction amplifier circuit, comprising a first correction FET having a gate, and a second correction FET having a gate, the first and the second correction FETs being connected together at a second connection at one of their source and drain and receiving a second bias current at said connection, and being connected to respective sides of a second current mirror by the other of their source and drain;

a resistor arranged to have a fixed voltage provided across it, one terminal of the resistor being connected to the gate of the first correction FET and the other terminal of the resistor being connected to the gate of the second correction FET;

a first bias FET connected to conduct a current from the second correction FET that does not flow through the second current mirror;

a second bias FET connected in current mirror configuration with the first bias FET to form a third current mirror, and configured to mirror and scale the current through the first bias FET to a selected one of the first input FET and the second input FET.

2. An operational amplifier as in claim 1, wherein the resistor is a middle resistor in a series connected plurality of resistors configured as a voltage divider.

3. An operational amplifier as in claim 1, further comprising a trim circuit connected between the second bias FET and the first input FET and the second input FET, and configured to programmably scale the current through the second bias FET and to mirror the scaled current selectably, under control of a select signal, to the first input FET or the second input FET in accordance with the select signal.

4. An operational amplifier having temperature-compensated offset correction, comprising:

an operational amplifier circuit, comprising a first input field effect transistor (FET) having a gate connected to receive a first input signal, and a second input FET having a gate connected to receive a second input signal, the first and the second input FETs being connected together at a first connection at one of their source and drain and receiving a first bias current at said connection, and being connected to respective sides of a first current mirror by the other of their source and drain, both sides of the first current mirror being connected to ground;

a correction amplifier circuit, comprising a first correction FET having a gate, and a second correction FET having a gate, the first and the second correction FETs being connected together at a second connection at one of their source and drain and receiving a second bias current at said connection, and being connected to respective sides of a second current mirror by the other of their source and drain, both sides of the second current mirror being connected to ground;

a resistor arranged to have a fixed voltage provided across it, one terminal of the resistor being connected to the gate of the first correction FET and the other terminal of the resistor being connected to the gate of the second correction FET;

a first bias FET having a drain and gate connected to a common node of the second correction FET and the second current mirror, and having a source connected to ground;

a trim circuit having a second bias FET connected in current mirror configuration with the first bias FET to form a third current mirror, and configured to mirror and scale a current through the first bias FET to a selected one of the first input FET and the second input FET.

5. An operational amplifier as in claim 4, wherein the resistor is a middle resistor in a series connected plurality of resistors configured as a voltage divider.

6. An operational amplifier as in claim 4, further comprising the trim circuit connected between the second bias FET and the first input FET and the second input FET, and configured to programmably scale the current through the second bias FET and to mirror the scaled current selectably, under control of a select signal, to the first input FET or the second input FET in accordance with the select signal.

* * * * *